United States Patent
Mok et al.

(10) Patent No.: US 7,382,976 B1
(45) Date of Patent: Jun. 3, 2008

(54) LIGHT SOURCE HAVING A VARIABLE FOCAL LENGTH

(75) Inventors: Thye Linn Mok, Mertajam (MY); Wooi Kin Goon, Penang (MY); Gim Eng Chew, Penang (MY); Kee Yean Ng, Penang (MY); Janet Bee Yin Chua, Perak (MY); Rene P. Helbing, Palo Alto, CA (US)

(73) Assignee: Avago Technologies ECB4 IP Pte Ltd, Singapore (SG)

( * ) Notice: Subject to any disclaimer, the term of this patent is extended or adjusted under 35 U.S.C. 154(b) by 316 days.

(21) Appl. No.: 11/223,636

(22) Filed: Sep. 9, 2005

(51) Int. Cl.
*G03B 15/02* (2006.01)
*G03B 15/06* (2006.01)
*G02B 1/06* (2006.01)
*G02B 3/12* (2006.01)

(52) U.S. Cl. .................. 396/62; 396/175; 359/666; 257/100

(58) Field of Classification Search .......... 396/61, 396/62, 175; 359/665–667; 362/18; 257/100
See application file for complete search history.

(56) References Cited

U.S. PATENT DOCUMENTS

| | | | | |
|---|---|---|---|---|
| H000445 H | * | 3/1988 | Bock et al. .............. 264/1.7 |
| 4,783,155 A | * | 11/1988 | Imataki et al. .............. 359/666 |
| 5,895,128 A | * | 4/1999 | Kishimoto et al. .......... 396/61 |
| 6,369,954 B1 | * | 4/2002 | Berge et al. ................ 359/666 |
| 7,288,798 B2 | * | 10/2007 | Chang et al. ................ 257/99 |
| 2004/0227838 A1 | * | 11/2004 | Atarashi et al. ........... 348/340 |
| 2006/0045501 A1 | * | 3/2006 | Liang et al. ................. 396/62 |

OTHER PUBLICATIONS

L. G. Commander, et al., Electrode Designs for Tunable Microlenses, Dept. of Electronic and Electrical Engineering, University College London, Torrington Place, London WC1E 7JE, World Wide Web:http://www.ee.uel.ac.us/~odevices, pp. 1-6.

Opto & Laser Europe, Liquid Lenses Eye Commercial Breakthrough, Nov. 2003, pp. 1-4.

* cited by examiner

*Primary Examiner*—W. B. Perkey
*Assistant Examiner*—Andrew Williams

(57) ABSTRACT

A variable focal length light source is constructed using a tunable focus length lens which can be adjusted in synchronization to the focal length of a camera lens. In one embodiment, a deformable lens is used in conjunction with an LED light source to provide the tunable focal length required for a camera flash device.

20 Claims, 3 Drawing Sheets

LIGHT SOURCE HAVING A VARIABLE FOCAL LENGTH

TECHNICAL FIELD

This invention relates to light sources and more particularly to light sources for use with cameras and even more particularly to such light sources which require variable focal lengths.

BACKGROUND OF THE INVENTION

It has become standard practice to use light emitting diodes (LEDs) as flash modules in mobile applications that have camera functions. For example, mobile phones or PDAs are increasingly equipped with camera modules for image capture and a flash module serves as an illumination source in low ambient light situations. These flash modules must produce a large amount of light each time they are activated and in some cases the light from the LED is not sufficient for a camera flash. This is particularly true if the image to be captured is far from the camera in a total dark (Zero lux) condition.

Mobile device cameras (such as cameras in phones, PDAs, etc.) have zoom functions for bringing distant images into closer focus. These zoom lenses allow the user to zoom in on small objects located far from the camera. If the light from the flash is unable to properly illuminate the subject, particularly under dark conditions, the resultant picture may not look good.

Some prior art flash arrangements have a moveable optical lens to channel the light from the flash to the desired viewing angle (focal length) to match the viewing angle (zoom focal length) of the camera.

BRIEF SUMMARY OF THE INVENTION

A variable focal length light source is constructed during a tunable focus length lens which can be adjusted in synchronization to the focal length of a camera lens. In one embodiment, a deformable lens is used in conjunction with an LED light source to provide the tunable focal length required for a camera flash device.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 5:
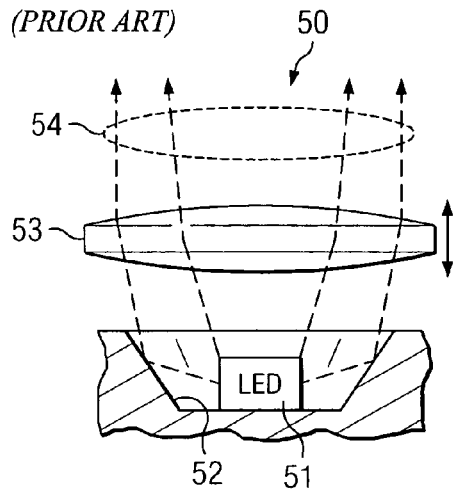
FIG. 5 shows a prior art moveable optical lens for changing the focal length of a light source.

Before beginning a discussion of the detailed description of the invention, it might be helpful to review some existing structures. FIG. 5 shows one prior art flash structure 50 having LED 51 as a light source with reflector cups 52 forcing the light (54) upward through movable optical lens 53. Lens 53 is mechanically moved closer or farther from LED 51 in order to change the focal length of light 54. This changes the viewing angle of light as well. In order for the lens to move, the width of the device must be such as to accommodate the full range of lens motion, typically on the order of 10 mm.

Figure 6A:
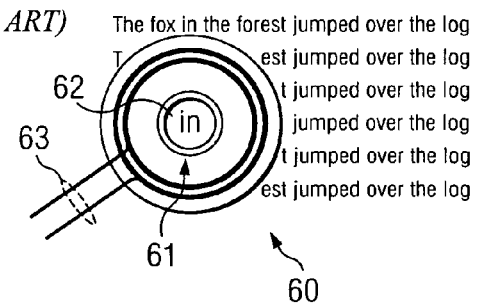
FIGS. 6A and 6B show prior art tunable focal length lens.
Figure 6B:
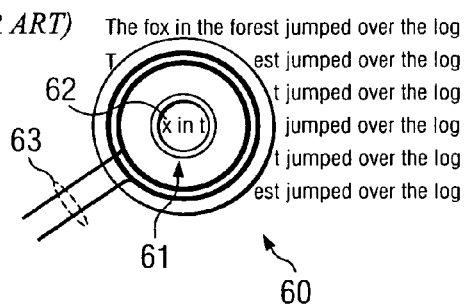

FIGS. 6A and 6B show prior art tunable focal length lens 60. Lens 60 is a plastic device that contains two liquids. One liquid (61) is based on a water soluble formulation, while the other (62) is oil based. The non-polar water based formulation is negatively biased. The curved interface between the oil and water layers acts as a lens. With no applied voltage, the lens focuses on objects at infinity as shown in FIG. 6B. However, when voltage is applied to the electrodes the lens is altered and the curvature of the liquid-liquid interface changes. This is shown in FIG. 6A where the focal length of the lens has changed (closer) so that the printing on sheet 63 is now readable. These lenses are versatile in that they can change their shape from concave to convex in a matter of milliseconds. Such a lens is shown in the November 2003 issue of Opto & Laser Europe, which reference is hereby incorporated by reference herein.

Figure 7A:
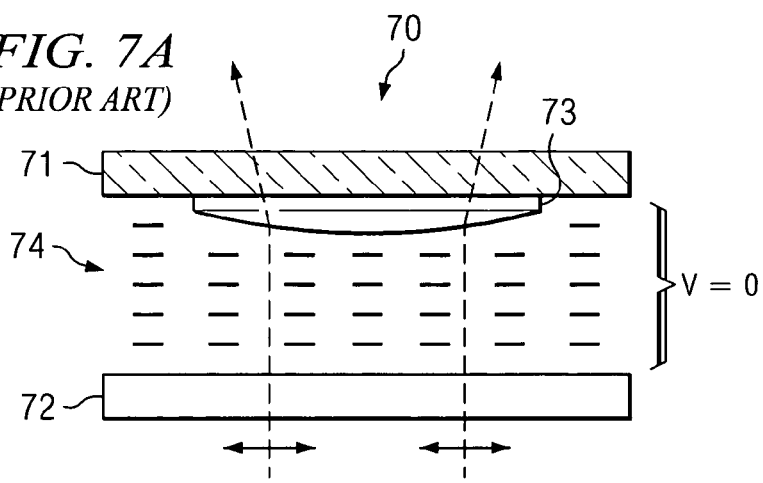
FIGS. 7A and 7B show a prior art design of a liquid crystal immersed microlens.
Figure 7B:
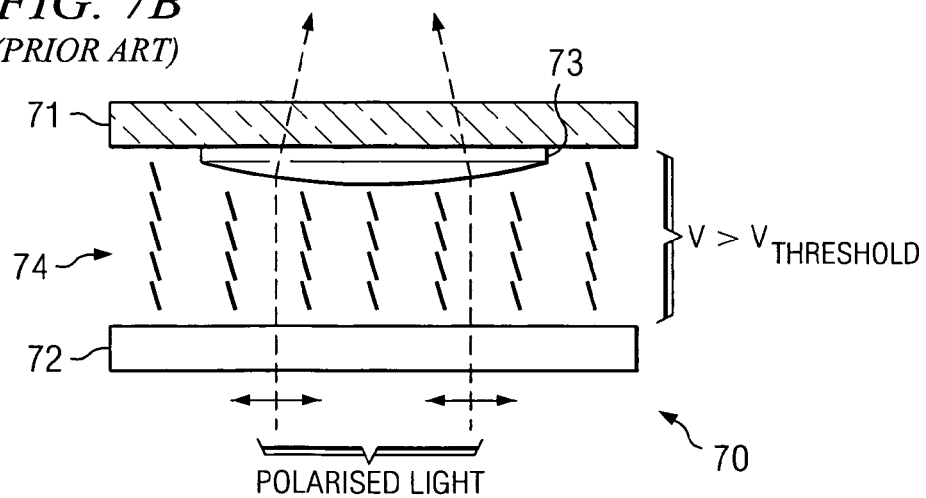

FIGS. 7A and 7B show light structure 70 having microlenses 73 which have been fabricated and immersed in nematic liquid crystal to give an electrically controllable focal length. The liquid crystal material is uniaxially birefringent and the effective birefringence can be controlled since director 74 (the average direction of the molecules) reorients towards an applied electric field as shown in FIG. 7B when voltage is applied. Thus, for light polarized parallel to the liquid crystal slow axis, the refractive index can be voltage controlled and, consequently, when a lensing interface is formed between a refractive material and the liquid crystal, the overall lens focal length can be voltage controlled. In this arrangement, structures 71 and 72 are glass. Such a structure is shown in Electrode Designs for Tunable Microlenses, L. G. Commander, S. E. Day and D. R. Selviah, Dept. of Electronic and Electrical Engineering, University College London which is hereby incorporated by reference herein.

Figure 1:
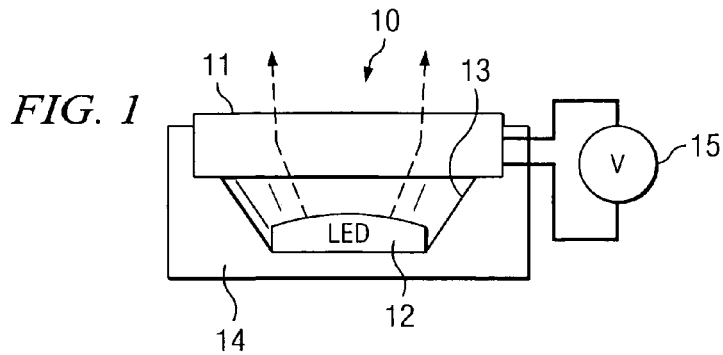
FIG. 1 shows one embodiment of a light source with a tunable lens.

FIG. 1 shows one embodiment of light source 10 with tunable lens 11. Device 10 combines the concepts shown in FIGS. 6A, 6B, 7A and 7B and uses voltage 15 to tune the focal length of the lens. In this embodiment, the light source is LED 12 held by substrate 14. Reflectors 13 reflect the light to impact on tunable lens 11. As discussed, lens 11 changes its focal angle (length) quickly and can be synchronized with a camera lens, such as lens 42 of camera device 40, FIG. 4. Camera device 40 is typically part of another device, such as a telephone, and has, for example, screen/keypad 44. Battery 43 can provide the voltage for tuning lens 11.

Figure 2:
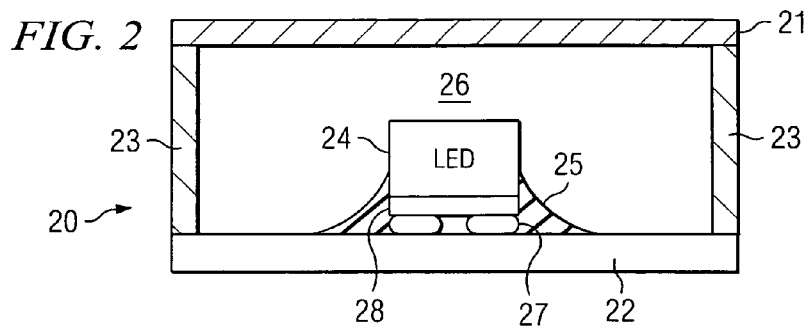
FIGS. 2, 3A and 3B show embodiments of flash devices with tunable lens arrangements.

FIG. 2 shows one embodiment of light source device 20 where LED chip 24 is directly immersed in the tunable lens. Isolative layer 25 is used to protect LED junction 28. The LED chip is mounted in this embodiment on substrate 22. The structure has sides 23 and top cover 21. The actual tunable lens 26 is confined between the top, the substrate and the sides.

Figure 3A:
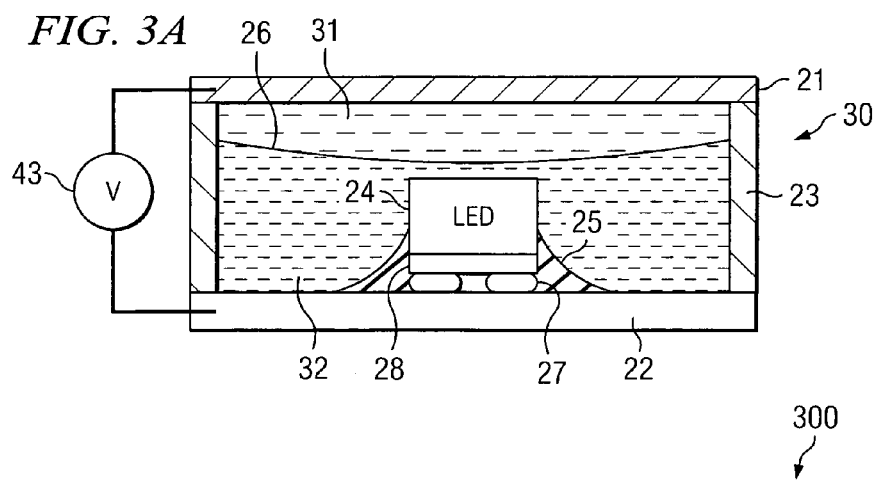

FIG. 3A shows one embodiment where tunable lens 26 is the interface between dissimilar materials, such as liquids. In the embodiment, a first liquid (for example, oil) and a second liquid (for example, water) is used and voltage is applied by voltage source 43 (FIG. 4).

Figure 3B:
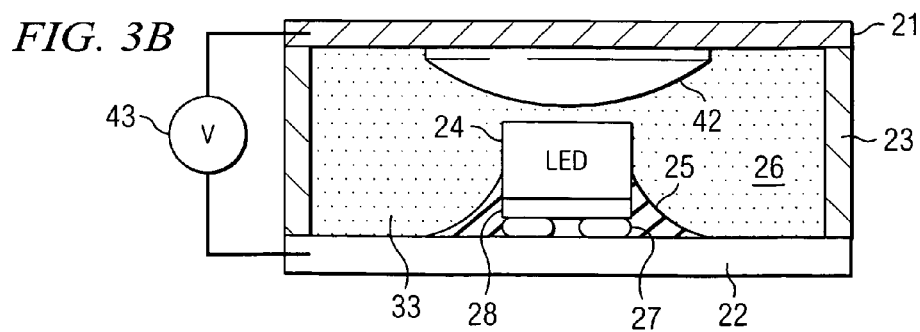

FIG. 3B shows one embodiment where tunable lens 26 is constructed in liquid crystal lenses 33. Voltage 43 is applied to the liquid crystal to change the refraction index. The overall focal length will change when the light from the liquid crystal interfaces with lens 42.

Figure 4:
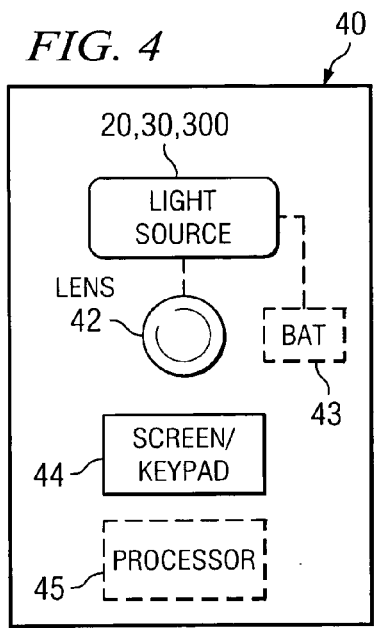
FIG. 4 shows one embodiment of a light source used in a camera device.

FIG. 4, as discussed above, shows one embodiment of a light source 20 mounted in a camera device and is coordinated, for example with processor 45, with lens 42.

Note that while the tunable lens is shown herein as fixed in position (i.e. the transverse axis of the lens does not move with respect to the light source) it can, in fact, move if desired thereby combining the features of tunable lens with features of a moveable lens. In this way, the movement (in and out) can be reduced while still providing adequate light on a subject.

The optics tunable system discussed herein is faster, more compact, more robust and less expensive to manufacture than motorized systems.

What is claimed is:

1. A light source having a variable focal length, the light source comprising:
    a substrate;
    an enclosure mounted on the substrate, the enclosure containing at least two liquids selected to form a liquid-to-liquid interface inside the enclosure, the liquid-to-liquid interface constituting a tunable lens; and
    an LED mounted on the substrate inside the enclosure and immersed in one of the two liquids.

2. The light source of claim 1, further comprising:
    an isolative layer located between the LED and the substrate for isolating and protecting a junction of the LED from the one of two liquids.

3. The light source of claim 1, further comprising:
    a voltage source coupled to the light source and operable to apply a voltage for varying a curvature of the liquid-to-liquid interface.

4. The light source of claim 1, wherein light emitted by the LED is transmitted through the liquid-to-liquid interface and out of a top cover of the enclosure.

5. The light source of claim 4, wherein the enclosure comprises a reflective side wall for reflecting light emitted by the LED towards the liquid-to-liquid interface.

6. The light source of claim 1, wherein the LED is a surface mount device mounted on a top surface of the substrate.

7. The light source of claim 1, wherein the two liquids are water and oil, and wherein the LED is immersed in water.

8. The light source of claim 1, wherein the two liquids are a water soluble formulation and an oil based formulation, and wherein the LED is immersed in the water soluble formulation.

9. A light source having a variable focal length, the light source comprising:
    a substrate;
    a lens;
    an enclosure mounted on the substrate with the lens mounted inside the enclosure on a top cover of the enclosure, the enclosure at least partially filled with liquid crystal material thereby forming a liquid crystal-to-lens interface inside the enclosure, the liquid crystal-to-lens interface constituting a tunable lens; and
    an LED mounted on the substrate inside the enclosure and immersed in the liquid crystal material.

10. The light source of claim 9, further comprising:
    an isolative layer located between the LED and the substrate for isolating and protecting a junction of the LED from the liquid crystal material.

11. The light source of claim 9, further comprising:
    a voltage source coupled to the light source and operable to apply a voltage for varying a curvature of the liquid crystal-to-lens interface.

12. The light source of claim 9, wherein the LED is positioned for directing light out of a top cover of the enclosure after propagating through the liquid crystal-to-lens interface and the lens.

13. The light source of claim 12, wherein the enclosure comprises a reflective side wall for reflecting light emitted by the LED towards the liquid crystal-to-lens interface.

14. The light source of claim 9, wherein the LED is a surface mount device mounted on a top surface of the substrate.

15. A method of constructing a light source having a variable focal length, the method comprising:
    providing a substrate;
    mounting an LED on the substrate;
    mounting an enclosure on the substrate, the enclosure positioned to enclose the LED; and
    immersing the LED in one of a) a liquid or b) a liquid crystal material by filling the enclosure with one of a) at least two liquids or b) liquid crystal material, respectively.

16. The method of claim 15, further comprising:
    providing an isolative layer between the LED and the substrate for isolating and protecting a junction of the LED from the one of a) the liquid or b) the liquid crystal material.

17. The method of claim 15, further comprising:
    upon immersing the LED in liquid crystal material, mounting a lens on a top cover of the enclosure thereby forming a liquid crystal-to-lens interface inside the enclosure.

18. The method of claim 17, wherein the lens is a camera lens.

19. The method of claim 15, wherein the at least two liquids are selected for forming a liquid-to-liquid interface inside the enclosure.

20. The method of claim 19, wherein the at least two liquids are water and oil, and wherein immersing the LED in the liquid comprises immersing the LED in water.

* * * * *

UNITED STATES PATENT AND TRADEMARK OFFICE
CERTIFICATE OF CORRECTION

PATENT NO. : 7,382,976 B1
APPLICATION NO. : 11/223636
DATED : June 3, 2008
INVENTOR(S) : Thye Linn Mok et al.

It is certified that error appears in the above-identified patent and that said Letters Patent is hereby corrected as shown below:

Title page of patent; (73) Assignee, delete "Avago Technologies ECB4 IP Pte Ltd," and insert --Avago Technologies ECBU IP (Singapore) Pte. Ltd.--.

Signed and Sealed this

Twenty-sixth Day of August, 2008

JON W. DUDAS
*Director of the United States Patent and Trademark Office*